(12) United States Patent
Zhang et al.

(10) Patent No.: US 10,571,512 B2
(45) Date of Patent: Feb. 25, 2020

(54) TEST DEVICE FOR PRINTED CIRCUIT BOARD ASSEMBLY

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yueyuan Zhang, Beijing (CN); Shancai Zhang, Beijing (CN); Yifei Zhan, Beijing (CN); Chengcheng Hou, Beijing (CN); Kun Li, Beijing (CN); Guanglei Yang, Beijing (CN); Zhaobo Jiang, Beijing (CN); Dayu Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 326 days.

(21) Appl. No.: 15/527,456
(22) PCT Filed: Oct. 19, 2016
(86) PCT No.: PCT/CN2016/102571
§ 371 (c)(1),
(2) Date: May 17, 2017
(87) PCT Pub. No.: WO2017/067457
PCT Pub. Date: Apr. 27, 2017

(65) Prior Publication Data
US 2018/0106855 A1    Apr. 19, 2018

(30) Foreign Application Priority Data
Oct. 23, 2016 (CN) .......................... 2015 1 0696115

(51) Int. Cl.
*G01R 1/04* (2006.01)
*G01R 31/28* (2006.01)
*G01R 1/073* (2006.01)

(52) U.S. Cl.
CPC ....... *G01R 31/2808* (2013.01); *G01R 1/0408* (2013.01); *G01R 1/07328* (2013.01); *G01R 1/07364* (2013.01)

(58) Field of Classification Search
CPC ............ G01R 31/2808; G01R 1/07364; G01R 1/07328; G01R 1/0408
See application file for complete search history.

(56) References Cited

U.S. PATENT DOCUMENTS 4,061,969 A * 12/1977 Dean .................. G01R 1/07328
324/756.04
4,820,975 A * 4/1989 Diggle ............... G01R 1/07335
324/750.22

(Continued)

FOREIGN PATENT DOCUMENTS

| CN | 2726152 Y | 9/2005 |
| CN | 101071190 A | 11/2007 |

(Continued)

OTHER PUBLICATIONS

Third Office Action for Chinese Patent Application No. 201510696115.3 dated Oct. 17, 2018.

(Continued)

*Primary Examiner* — Son T Le
(74) *Attorney, Agent, or Firm* — Calfee, Halter & Griswold LLP

(57) ABSTRACT

A test device for a printed circuit board assembly is disclosed. The test device includes a test platform for securing a printed circuit board assembly to be tested and a positioning platform located above the test platform and for securing a plurality of test probes. The plurality of test probes are secured at the bottom of the positioning platform and the secured positions in the positioning platform thereof are adjustable to align the test points on the printed circuit board assembly to be tested.

7 Claims, 1 Drawing Sheet

(56) References Cited

U.S. PATENT DOCUMENTS

| | | | | |
|---|---|---|---|---|
| 6,992,496 B2* | 1/2006 | Winter | ............... | G01R 1/0441 |
| | | | | 324/750.25 |
| 2004/0137800 A1* | 7/2004 | Jing | ............... | H01R 13/2421 |
| | | | | 439/700 |
| 2007/0264878 A1 | 11/2007 | Hirobe et al. | | |
| 2015/0247882 A1 | 9/2015 | Lee et al. | | |

FOREIGN PATENT DOCUMENTS

| | | | |
|---|---|---|---|
| CN | 201662607 | A | 12/2010 |
| CN | 201662607 | U | 12/2010 |
| CN | 202372541 | U | 8/2012 |
| CN | 102736022 | A | 10/2012 |
| CN | 202735366 | U | 2/2013 |
| CN | 103809072 | A | 5/2014 |
| CN | 104865425 | A | 8/2015 |
| CN | 105388412 | A | 3/2016 |
| CN | 105403826 | A | 3/2016 |
| DE | 2613858 | B1 | 7/1977 |

OTHER PUBLICATIONS

International Search Report for Chinese International Application No. PCT/CN2016/102571 dated Jan. 20, 2017.
Second Office Action from Chinese Patent Application No. 201510696115.3 dated Mar. 22, 2018.
First Office Action from Chinese Patent Application No. 201510696115.3 dated Jul. 13, 2017.

\* cited by examiner

TEST DEVICE FOR PRINTED CIRCUIT BOARD ASSEMBLY

RELATED APPLICATIONS

The present application is the U.S. national phase entry of PCT/CN2016/102571, with an international filing date of Oct. 19, 2016, which claims the benefit of Chinese Patent Application No. 201510696115.3, filed on Oct. 23, 2015, the entire disclosures of which are incorporated herein by reference.

TECHNICAL FIELD

The present application relates to a test device and, more particularly, to a test device for printed circuit board assembly (PCBA).

BACKGROUND

A Printed Circuit Board Assembly (PCBA) is a printed circuit board (PCB) having welded and assembled electronic components thereon, which is obtained following the processes such as SMT (Surface Mount Technology) and DIP (Dual Inline-Pin Package technology).

In order to ensure the quality of the printed circuit board assembly, the printed circuit board assembly is typically tested using a test device for printed circuit board assembly. When testing the printed circuit board assembly with a conventional needle bed tooling, the printed circuit board assembly which is located on a plane surface above the test platform is depressed by the drive lever so that a test point of the printed circuit board assembly contacts a test probe fixed to the test platform; and then a test signal is provided to the test point of the printed circuit board assembly through the probe head to detect the function of the printed circuit board assembly. However, in the prior art, each needle bed tooling is only designed for a particular type or model of printed circuit board assembly. When testing different types or models of printed circuit board assemblies, it is often necessary to redesign the test tooling for the printed circuit board assembly. This will result in higher design and maintenance costs. In addition, this test tool which integrates the test platform with the test probe is not flexible enough to accommodate a wide variety of touch panel printed circuit board assemblies having varied shapes.

Therefore, there is a need for a test tooling that can be applied to a variety of printed circuit board assemblies to reduce the cost of tooling and to improve the flexibility of testing.

SUMMARY

In view of the above problems in the prior art, the present application proposes an improved test device.

According to one exemplary embodiment, there is provided a test device for printed circuit board assembly comprising a test platform for securing a printed circuit board assembly to be tested; and a positioning platform located above the test platform and for securing a plurality of test probes, wherein the plurality of test probes are secured at the bottom of the positioning platform and the secured positions in the positioning platform thereof are adjustable to align the test points on the printed circuit board assembly to be tested respectively.

In certain exemplary embodiments, the test probe comprises a base and a probe head which are interconnected, the probe head being secured to the positioning platform through the base.

In some further embodiments, the test probe further comprises a housing which is provided with an opening toward the test platform side; and the probe head comprises a probe head body, a portion of which extends through the opening and protrudes from the housing; and the remainder of the probe head body is disposed within a receiving chamber surrounded by the base and the housing.

In certain exemplary embodiments, the probe head further comprises a limiting structure disposed within the receiving chamber for limiting the length of the probe head extending out of the opening.

In certain exemplary embodiments, the limiting structure is fixed to the probe head body and extends transversely to outside of the probe head body, and the sum of the lateral width of the limiting structure and the lateral width of the probe head body is greater than the lateral width of the opening.

In certain exemplary embodiments, the test probe further comprises a spring, one end of which is fixed to the probe head and the other end is fixed to the base.

In certain exemplary embodiments, the test probe further comprises a wire connecting the probe head and an external test circuit.

In certain exemplary embodiments, the bottom of the positioning platform is provided with a plurality of sliding grooves, and the base is embedded in the sliding groove and is movable along the sliding groove. In this embodiment, the position of the test probe can be adjusted by moving the test probe along the sliding groove.

In certain exemplary further embodiments, the bottom of the positioning platform is provided with a plurality of holes into which the base of the test probe is able to be embedded. In this embodiment, when the test probe is positioned corresponding to a pattern of the test points on the printed circuit board assembly, the test probe is only needed to be removed from the hole of the positioning platform and mounted to other position.

In certain exemplary embodiments, the hole and the base have a threaded structure respectively, and the test probe is secured to the positioning platform by the threaded structure.

In certain exemplary embodiments, the positioning platform comprises an electromagnetic platform that provides an electromagnetic force in response to power supply, the base being made of a material that can be attracted by a magnet and being fixed to the electromagnetic platform when the electromagnetic platform is powered. By controlling the power supply of the electromagnetic platform, it is possible to realize the transition between the locked state and the movable state of the test probe.

In certain exemplary further embodiments, the electromagnetic platform comprises an electromagnet and a relay for controlling power supply to the electromagnet.

The printed circuit board assembly described above may be a printed circuit board assembly for a touch panel.

The advantage of the test device according to the embodiment of the present application is that, it is possible to easily test different types of printed circuit board assemblies by flexibly adjusting the fixed positions of the test probes on the bottom of the positioning platform. This reduces the design and maintenance costs of the test device, reduces waste, and improves test efficiency.

Other features and advantages of the embodiments of the present disclosure will be understood when reading the following description in conjunction with the accompanying drawings, wherein the drawings illustrate the principles of embodiments of the disclosure by way of example.

BRIEF DESCRIPTION OF THE DRAWINGS

The foregoing and other aspects, features and benefits of the various embodiments of the present disclosure will become more apparent from the following detailed description and accompanying drawings.

The same reference numerals in the various drawings indicate the same or similar parts.

DETAILED DESCRIPTION

Hereinafter, the principle of the embodiment of the present disclosure will be described with reference to the drawings. It is to be understood that the embodiments are merely given out for facilitating better understanding and further practicing the disclosure by those skilled in the art and are not intended to limit the scope of the disclosure. For example, features that are illustrated or described as part of one embodiment may be used in conjunction with the features of another embodiment to produce still another embodiment.

Figure 1:
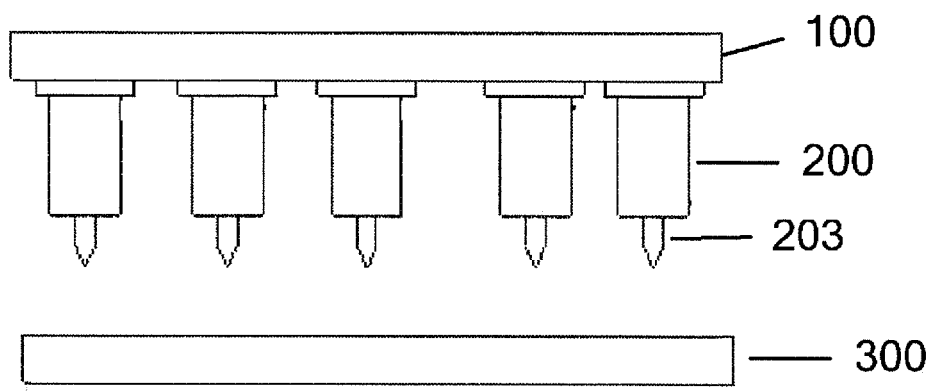
FIG. 1 is a schematic diagram showing a test device for printed circuit board assembly according to an embodiment of the present disclosure.

FIG. 1 is a schematic diagram showing a test device for printed circuit board assembly according to an embodiment of the present disclosure. As shown in FIG. 1, the test device for printed circuit board assembly comprises a positioning platform 100, a test probe 200, and a test platform 300. The positioning platform 100 is located above the test platform 300 and the test probe 200 may be mounted on the bottom of the positioning platform 100 to face the test platform 300. The test platform 300 is used to fix the printed circuit board assembly to be tested (not shown). In this embodiment, the test probe 200 may be separated from the test platform 300. The embodiments of the present application can flexibly change the secured position of the test probe 300 on the positioning platform 100 in accordance with the location of the test point of the printed circuit board assembly, as compared to the conventional solution of permanently welding the test probe to the test platform in the prior art. At the time of testing, the positioning platform 100 located above the test platform 300 is configured to be able to secure a plurality of test probes 200 to the bottom of the positioning platform 100 such that the plurality of test probes 200 are respectively aligned with the test points on the printed circuit board assembly.

In various embodiments, the test probe 200 may be secured to the bottom of the positioning platform 100 in a variety of ways. In one embodiment, a plurality of sliding grooves may be provided at the bottom of the positioning platform 100, and the test probe 200 may be configured to be embedded in the sliding groove. Thus, the test probe 200 can be positioned above the test point of the printed circuit board assembly by moving the test probe 200 along the slide slot, and the position of the test probe 200 may be varied depending on the printed circuit board assembly to be tested.

In another embodiment, a plurality of holes may be provided at the bottom of the positioning platform 100, and the test probe 200 is configured to be secured in the hole by a fastener. For example, the holes and test probes are configured to have a threaded structure, respectively, and the test probe is secured to the positioning platform by the threaded structure. It will be appreciated that a plurality of dense screw holes may be arranged at the bottom of the positioning platform 100 so that the test probe 200 can be positioned precisely above the test point and the position of the probe 200 can be changed depending on the printed circuit board assembly to be tested.

In another embodiment, the positioning platform 100 is an electromagnetic platform and the base portion of the test probe is made of a material that can be attracted by a magnet, and the test probe can thus be secured to the bottom of the electromagnetic platform by means of an electromagnetic force generated by the electromagnetic platform. And in the case of cutting off the power for the electromagnetic platform, the test probe can be released from the electromagnetic platform so that its position on the electromagnetic platform can be adjusted. In a specific example, the electromagnetic platform may comprise an electromagnet, a relay, and a plate made of a material that is permeable to magnetism. The relay is used to control the power supply for the electromagnet. And when the position of the test probe needs to be adjusted, the relay is first de-energized, and then the position of the test probe on the plate is changed, and the relay is energized again after the adjustment, so that the test probe is again attracted on the electromagnetic platform.

It will be appreciated that in other specific examples, the embodiment in which the positioning platform is made of electromagnetic platform may also be combined with embodiments in which the positioning platforms as in the first two embodiments include sliding slots or holes, so as to achieve better and more precise fixation.

Figure 2:
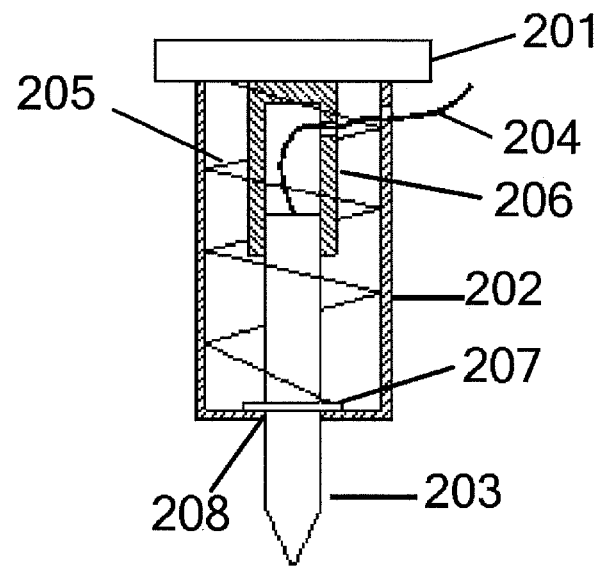
FIG. 2 is a schematic diagram showing the structure of a test probe according to an embodiment of the present disclosure.

FIG. 2 is a schematic view showing a structure of a test probe 200 according to an embodiment of the present disclosure. As shown, the test probe 200 comprises at least a base 201, a housing 202, and a probe head 203.

A side of the housing facing the test platform 300 is provided with an opening 208. The probe head 203 comprises a probe head body which passes through the opening 208 and protrudes from the housing 202. The remainder of the head body is disposed within the receiving chamber enclosed by the base 201 and the housing 202. The housing 202 may be connected to the base 201 by welding or sticking. The probe head 203 also comprises a limiting structure 207 disposed within the receiving chamber for limiting the length of the portion of the probe head extending out of the opening 208. The limiting structure 207 is fixed to the probe head body and extends horizontally beyond the probe head body, and the sum of the lateral widths of the limiting structure 207 and the probe head body is greater than the lateral width of the opening 208.

The inside of the housing 202 may be provided with a structure for restricting the movement of the probe head 203 so that the probe head 203 is only able to move in the vertical direction. Such a clamping structure 206 is shown illustratively in FIG. 2. The clamping structure 206 has a bottom and two side walls extending vertically from the bottom, the bottom being connected to the base 201 by welding or sticking. The two side walls of the clamping structure are used to clamp the probe head 203 so that the probe head 203 can only move longitudinally in the direction defined by the two side walls.

The test probe 200 also comprises a spring 205, one end of which is fixed to the probe head 203 and the other end to the base 201. In one example, one end of the spring 205 is connected to the base 201 and the other end is connected to a blocking structure formed on the probe head 203. By providing the spring 205 inside the housing 202, when the positioning platform 100 approaches the test platform 300 under the action of an external force, the probe head 203 is subjected to an acting force from the spring 205 towards the printed circuit board assembly and thus contacts stably the test points of the printed circuit board assembly under the action of the spring force.

The test probe 200 may also comprise a wire 204 connecting the probe head 203 and an external test circuit.

As described above, in some embodiments, the test probe 200 may be secured to the bottom of the positioning platform 100 in a variety of ways. Referring to the structure of the test probe 200 shown in FIG. 2, the test probe may be fixed by a plurality of examples as follows. In one example, a plurality of sliding grooves may be provided at the bottom of the positioning platform 100, and the base 201 of the test probe 200 is configured to be embedded in the sliding groove. Thus, the test probe 200 can be positioned over the test point of the printed circuit board assembly by moving the test probe 200 along the sliding groove. In one example, a plurality of holes may be provided at the bottom of the positioning platform 100, and the base 201 of the test probe 200 is configured to be secured in the hole by a fastener. For example, the hole and the base 201 are configured to have a threaded structure, and the test probe is fixed to the positioning platform by the threaded structure. In one example, the positioning platform 100 is an electromagnetic platform and the base 201 of the test probe is made of a material such as a metal or the like that can be magnetically attracted by a magnet, and the test probe can be fixed to the bottom of the electromagnetic platform by an electromagnetic force generated by an electromagnetic platform.

In other embodiments, a plurality of test probes are combined into a group as a test module corresponding to a particular plurality of test points, which can reduce the cost of the test device. For example, a plurality of probe heads may be provided inside a test probe, and the probe heads may be arranged in a predetermined pattern.

It will be apparent to those skilled in the art that various modifications and variations can be made in the embodiments of the present application without departing from the spirit and scope of the present application. In this manner, the present application is intended to cover such modifications and variations if such modifications and variations are within the scope of the appended claims and the equivalents thereof. The word "comprising" does not exclude the presence of other elements or steps not listed in the claims. Certain measures recited in mutually different dependent claims do not indicate that the combination of these measures cannot be used to advantage. Any reference signs in the claims should not be construed as limiting the scope.

The invention claimed is:

1. A test device comprising:
a test platform for securing a printed circuit board assembly to be tested; and
a positioning platform located above the test platform and for securing a plurality of test probes,
wherein the plurality of test probes are secured at a bottom of the positioning platform and secured positions of the test probes in the positioning platform are adjustable to align with test points on the printed circuit board assembly to be tested,
wherein each test probe of the plurality of test probes comprises a base and a probe head which are interconnected, the probe head being secured to the positioning platform through the base, and
wherein the positioning platform and the test probe are of a configuration selected from a group consisting of:
(i) the bottom of the positioning platform being provided with a plurality of sliding grooves, and the base being embedded in a corresponding one of the plurality of sliding grooves and being movable along the corresponding one of the plurality of sliding grooves,
(ii) the bottom of the positioning platform being provided with a plurality of holes into which the base of the test probe is able to be embedded, the hole and the base having respective threaded structures, and the test probe being secured to the positioning platform by the threaded structures,
(iii) the positioning platform comprising an electromagnetic platform that provides an electromagnetic force in response to power supply, and the base being made of a material that can be attracted by a magnet and being fixed to the electromagnetic platform upon power-on of the electromagnetic platform,
(iv) the bottom of the positioning platform being provided with a plurality of sliding grooves, the base being embedded in a corresponding one of the plurality of sliding grooves and being movable along the corresponding one of the plurality of sliding grooves, the positioning platform comprising an electromagnetic platform that provides an electromagnetic force in response to power supply, and the base being made of a material that can be attracted by a magnet and being fixed to the electromagnetic platform upon power-on of the electromagnetic platform, and
(v) the bottom of the positioning platform being provided with a plurality of holes into which the base of the test probe is able to be embedded, the positioning platform comprising an electromagnetic platform that provides an electromagnetic force in response to power supply, and the base being made of a material that can be attracted by a magnet and being fixed to the electromagnetic platform upon power-on of the electromagnetic platform.

2. The test device according to claim 1, wherein
the test probe further comprises a housing which is provided with an opening toward the test platform; and
the probe head comprises a probe head body, a portion of which extends out of the housing through the opening; and remainder of the probe head body is disposed within a receiving chamber surrounded by the base and the housing.

3. The test device according to claim 2, wherein
the probe head further comprises a limiting structure disposed within the receiving chamber for limiting a length of the portion of the probe head body extending out of the housing.

4. The test device according to claim 3, wherein
the limiting structure is fixed to the probe head body and extends transversely to outside of the probe head body, and a sum of a lateral width of the limiting structure and a lateral width of the probe head body is greater than a lateral width of the opening.

5. The test device according to claim 1, wherein
the test probe further comprises a spring, one end of which is fixed to the probe head and the other end is fixed to the base.

6. The test device according to claim 1, wherein the test probe further comprises a wire for connecting the probe head and an external test circuit.

7. The test device according to claim 1, wherein the electromagnetic platform comprises an electromagnet and a relay for controlling power supply to the electromagnet.

\* \* \* \* \*